US009515100B2

United States Patent
Im

(10) Patent No.: US 9,515,100 B2
(45) Date of Patent: Dec. 6, 2016

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventor: Jang Soon Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/355,505

(22) PCT Filed: Dec. 7, 2013

(86) PCT No.: PCT/CN2013/088826
§ 371 (c)(1),
(2) Date: Apr. 30, 2014

(87) PCT Pub. No.: WO2014/190712
PCT Pub. Date: Dec. 4, 2014

(65) Prior Publication Data
US 2015/0179679 A1    Jun. 25, 2015

(30) Foreign Application Priority Data
May 29, 2013  (CN) .......................... 2013 1 0206614

(51) Int. Cl.
H01L 29/10     (2006.01)
H01L 29/12     (2006.01)
(Continued)

(52) U.S. Cl.
CPC ......... H01L 27/1251 (2013.01); G02F 1/1362 (2013.01); H01L 21/0271 (2013.01);
(Continued)

(58) Field of Classification Search
CPC .......................... H01L 27/1259; H01L 27/1251
(Continued)

(56) References Cited

U.S. PATENT DOCUMENTS

2003/0170944 A1*  9/2003  Kimura ................ G09G 3/3225
                                                    438/200
2007/0262311 A1* 11/2007  Liu ......................... H01L 29/04
                                                     257/66
(Continued)

FOREIGN PATENT DOCUMENTS

CN       1319892 A     10/2001
CN     101071793 A     11/2007
(Continued)

OTHER PUBLICATIONS

Machine translation of Ding et al., CN 102903674, Jan. 30, 2013.*
(Continued)

Primary Examiner — Hsin-Yi Hsieh
(74) Attorney, Agent, or Firm — Ladas & Parry LLP

(57) ABSTRACT

Embodiments of the present invention provide an array substrate, a manufacturing method thereof and a display device. The method for manufacturing the array substrate comprises: forming a pattern of an active layer of a switching thin-film transistor (TFT) and a pattern of a corresponding pixel electrode on a base substrate, in which the active layer of the switching TFT and the pixel electrode are on the same layer.

11 Claims, 2 Drawing Sheets

(51) Int. Cl.
*H01L 27/12* (2006.01)
*G02F 1/1362* (2006.01)
*H01L 21/02* (2006.01)
*H01L 21/027* (2006.01)
*H01L 29/66* (2006.01)
*H01L 29/786* (2006.01)

(52) U.S. Cl.
CPC .. *H01L 21/02532* (2013.01); *H01L 21/02565* (2013.01); *H01L 21/02592* (2013.01); *H01L 21/02667* (2013.01); *H01L 27/1222* (2013.01); *H01L 27/1225* (2013.01); *H01L 27/1259* (2013.01); *H01L 29/66757* (2013.01); *H01L 29/66969* (2013.01); *H01L 29/7869* (2013.01); *H01L 29/78675* (2013.01)

(58) Field of Classification Search
USPC .......................................................... 257/43
See application file for complete search history.

(56) References Cited

U.S. PATENT DOCUMENTS

| | | | |
|---|---|---|---|
| 2007/0298548 | A1 | 12/2007 | Nagata et al. |
| 2009/0215212 | A1 | 8/2009 | Liu et al. |
| 2010/0271349 | A1* | 10/2010 | Liu ...................... G09G 3/3225 345/205 |
| 2013/0037800 | A1 | 2/2013 | Matsukizono |
| 2013/0207087 | A1* | 8/2013 | Kim ................... H01L 27/3225 257/40 |
| 2014/0175385 | A1 | 6/2014 | Li et al. |

FOREIGN PATENT DOCUMENTS

| CN | 101090125 A | 12/2007 |
|---|---|---|
| CN | 102651455 A | 8/2012 |
| CN | 102859702 A | 1/2013 |
| CN | 102903674 A | 1/2013 |
| CN | 103018974 A | 4/2013 |
| CN | 103295962 A | 9/2013 |

OTHER PUBLICATIONS

Second Office Action issued by State Intellectual Property Office of the People's Republic of China ("SIPO") (Chinese Language) on Apr. 3, 2015, in Chinese Patent Application No. 201310206614.0; twelve (12) pages.

English Translation of Second Office Action issued by State Intellectual Property Office of the People's Republic of China ("SIPO") on Apr. 3, 2015, in Chinese Patent Application No. 201310206614.0; ; eleven (11) pages.

English Abstract of CN101071793A (listed above under Foreign Patent Documents); 1 page.

International Search Report for International Application No. PCT/CN2013/088826, 16pgs.

The State Intellectual Property Office of the People's Republic of China ("SIPO") (Chinese Language) Office Action issued on Nov. 3, 2014 by SIPO in Chinese Patent Application No. 201310206614.0; eleven (11) pages.

English Translation of the State Intellectual Property Office of the People's Republic of China ("SIPO") Office Action issued on Nov. 3, 2014 by SIPO in Chinese Patent Application No. 20130206614.0; ten (10) pages.

English abstract of CN101090125(A) listed above; one (1) page.

Third Chinese Office Action dated Oct. 10, 2015; Appln. No. 201310206614.0.

International Preliminary Report on Patentability issued Dec. 1, 2015; PCT/CN2013/088626.

* cited by examiner

ARRAY SUBSTRATE, MANUFACTURING METHOD THEREOF AND DISPLAY DEVICE

CROSS REFERENCE TO RELATED APPLICATIONS

This application is based on International Application No. PCT/CN2013/088826 filed on Dec. 7, 2013, which claims priority to Chinese National Application No. 201310206614.0 filed on May 29, 2013. The entire contents of each and every foregoing application are incorporated herein by reference.

FIELD OF THE INVENTION

Embodiments of the present invention relate to an array substrate, a manufacturing method thereof and a display device.

BACKGROUND

A complementary metal oxide semiconductor (CMOS) is formed by a p type channel metal oxide semiconductor (PMOS) and an n type channel metal oxide semiconductor (NMOS).

Currently, the low-temperature polysilicon (LTPS) technology is usually adopted to prepare semiconductors of a PMOS area and an NMOS area in a CMOS circuit. As illustrated in FIG. 1, in order to form an array substrate of a PMOS and NMOS circuit, the array substrate comprises a substrate 101, active layers (an active layer 102 of a PMOS transistor and an active layer 102' of an NMOS transistor), a gate insulating layer 103, gate electrodes (a gate electrode 104 of the PMOS transistor and a gate electrode 104' of the NMOS transistor), an insulating spacer layer 105 (including a through hole thereon), source and drain electrodes (source and drain electrodes 106 of the PMOS transistor and source and drain electrodes 106' of the NMOS transistor), a passivation layer 107, a planarization layer 108, a pixel electrode 109 and a pixel define layer 110 in sequence from the bottom up. The process for manufacturing the array substrate by the LTPS technology requires more than five coating processes and 11 masks. The processes of the 11 masks are as follows:

1) Active layer mask;
2) Gate electrode (gate line) mask;
3) P+ doped mask;
4) N+ doped mask;
5) Lightly doped drain (LDD) mask;
6) Through hole mask;
7) Source and drain electrode mask;
8) Passivation layer mask;
9) Planarization layer mask;
10) Pixel electrode (anode) mask;
11) Pixel define layer (PDL) mask.

The above manufacturing process has the defects of complex process and high equipment investment and manufacturing cost.

SUMMARY

The embodiment of the present invention provides a method for manufacturing an array substrate, which comprises step S1: forming a pattern of an active layer of a switching thin-film transistor (TFT) and a pattern of a corresponding pixel electrode on a base substrate, wherein the active layer of the switching TFT and the pixel electrode are on a same layer.

In one example, the step S1 comprises: forming a metal oxide semiconductor film and patterning the metal oxide semiconductor film to form the patterns of the active layer of the switching TFT and the pixel electrode.

In one example, the step S1 comprises: forming a transparent conductive film and patterning the transparent conductive film to form the pattern of the pixel electrode; and forming a metal oxide semiconductor film and patterning the metal oxide semiconductor film to form the pattern of the active layer of the switching TFT.

In one example, the step S1 further comprises: forming a pattern of an active layer of a driving TFT on the same layer.

In one example, the step of forming the pattern of the active layer of the driving TFT on the same layer comprises: forming an amorphous silicon film and crystallizing the amorphous silicon film to form a polysilicon film; and patterning the polysilicon film to form the pattern of the active layer of the driving TFT.

In one example, the metal oxide semiconductor film is an indium gallium zinc oxide (IGZO) film, a zinc oxide (ZnO) film, an indium zinc oxide (IZO) film, an indium tin zinc oxide (ITZO) film or a hafnium indium zinc oxide (HIZO) film.

In one example, the method for manufacturing the array substrate further comprises:

step S2: forming a pattern of a gate insulating layer, a pattern of a gate electrode of the driving TFT and a pattern of a gate electrode of the switching TFT on the base substrate obtained after the step S1;

step S3: doping the active layer of the driving TFT on the base substrate obtained after the step S2;

step S4: forming patterns of an insulating spacer layer, a through hole formed on the insulating spacer layer, and a pixel electrode recess on the base substrate obtained after the step S3, wherein one part of the pattern of the pixel electrode is exposed via the pixel electrode recess;

step S5: forming patterns of a source electrode and a drain electrode of the driving TFT and patterns of a source electrode and a drain electrode of the switching TFT on the base substrate obtained after the step S4, wherein the drain electrode of the driving TFT is connected with the pixel electrode; and step S6: forming a pattern of a pixel define layer on the base substrate obtained after the step S5.

In one example, the step S2 comprises:

forming a first insulating film which is taken as the gate insulating layer; and forming a first metal film on the gate insulating layer and patterning the first metal film to respectively form the pattern of the gate electrode of the driving TFT and the pattern of the gate electrode of the switching TFT at areas corresponding to the pattern of the active layer of the driving TFT and the pattern of the active layer of the switching TFT.

In one example, the step S3 further comprises:

applying photoresist and performing exposure and development on the photoresist via a mask to retain the photoresist at the area of the pattern of the active layer of the switching TFT and the area of the pattern of the pixel electrode, remove the photoresist at the area of the pattern of the active layer of the driving TFT by development, and expose the pattern of the active layer of the driving TFT; and doping the active layer of the driving TFT and removing the retained photoresist after the doping process.

In one example, the step S4 comprises: forming a second insulating film which is taken as the insulating spacer layer; and forming a first through hole and a second through hole which run through the insulating spacer layer and the gate insulating layer and reach the pattern of the active layer of the driving TFT, a third through hole and a fourth through hole which run through the insulating spacer layer and the gate insulating layer and reach the pattern of the active layer of the switching TFT, a pixel electrode recess which runs through the insulating spacer layer and the gate insulating layer and reaches the pattern of the pixel electrode, by a patterning process, wherein the first through hole and the second through hole correspond to areas of the source electrode and the drain electrode of the driving TFT to be formed; and the third through hole and the fourth through hole correspond to areas of the source electrode and the drain electrode of the switching TFT to be formed.

In one example, the step S5 comprises: forming a second metal film and patterning the second metal film to form the patterns of the source electrode and the drain electrode of the driving TFT and the patterns of the source electrode and the drain electrode of the switching TFT, wherein the drain electrode of the driving TFT is connected with the pixel electrode.

In one example, the step S6 comprises: forming a third insulating film and patterning the third insulating film so as to expose one part of the pattern of the pixel electrode under the third insulating film and hence form the pattern of the pixel define layer.

Another embodiment of the present invention provides an array substrate, which comprises: a driving TFT, a switching TFT and a pixel electrode disposed on a substrate, wherein a drain electrode of the switching TFT is connected with a source electrode of the driving TFT; a drain electrode of the driving TFT is connected with the pixel electrode, wherein both the pixel electrode and an active layer of the switching TFT are on a same layer.

In one example, an active layer of the driving TFT is on the same layer.

In one example, the driving TFT is a polysilicon TFT.

In one example, the switching TFT is a metal oxide TFT.

In one example, the pixel electrode and the active layer of the switching TFT are made of a same material.

Still another embodiment of the present invention provides a display device, which comprises the array substrate according to any one of the above examples.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

One technical problem to be solved by the embodiment of the present invention is to form an array substrate with simple process.

For instance, the method for manufacturing the array substrate provided by the embodiment of the present invention comprises the following steps S1 to S6.

Step S1: forming patterns of an active layer 202 of a driving TFT, an active layer of a switching TFT and a pixel electrode on the same layer on a base substrate 201.

Figure 1:
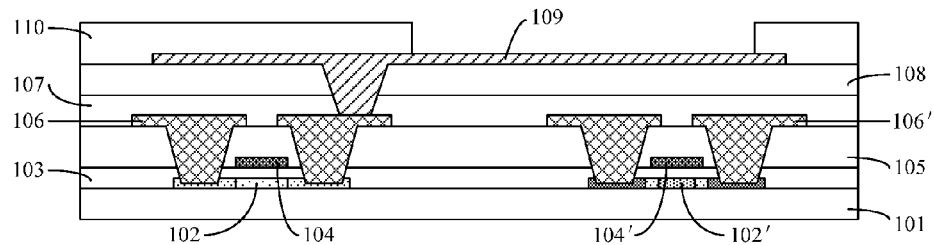
FIG. 1 is a schematic structural view of an array substrate in the prior art.
Figure 2:
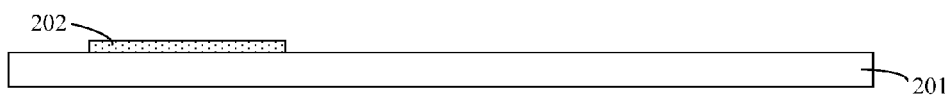
FIG. 2 is a schematic structural view illustrating the process of forming an active layer of a driving TFT on a base substrate in the method for manufacturing an array substrate provided by the embodiment of the present invention.

The step S1, for instance, may be performed as follows. As illustrated in FIG. 2, an amorphous silicon (a-Si) film is formed on the base substrate 201 and the a-Si film is crystallized to form a polysilicon film. The a-Si film may be formed by a plurality of methods such as deposition, coating and sputtering. The crystallization process may adopt the means of u-crystallization, laser annealing, metal-induced crystallization (MIC), metal-induced lateral crystallization (MILC) or continuous grain silicon (CGS). The polysilicon film is patterned to form the pattern of the active layer 202 of the driving TFT. The patterning process, for instance, includes photoresist coating, exposure, development, etching, photoresist removing and the like. The active layer 202 of the driving TFT formed herein is made of polysilicon materials. In one example, the driving TFT may be a PMOS transistor.

Figure 3:
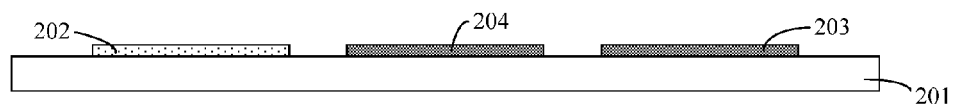
FIG. 3 is a schematic structural view illustrating the process of forming patterns of the active layer of the driving TFT, an active layer of a switching TFT and a pixel electrode on the base substrate in the method for manufacturing the array substrate provided by the embodiment of the present invention.

As illustrated in FIG. 3, the corresponding active layer 203 of the switching TFT and the corresponding pixel electrode 204 are formed on the same layer with the active layer 202 of the driving TFT. The process of forming the active layer 203 of the switching TFT and the pixel electrode 204 may adopt the following two modes:

Mode 1: forming a transparent conductive film and forming a pattern of the pixel electrode 204 by the patterning process; and forming a metal oxide semiconductor film and forming a pattern of the active layer 203 of the switching TFT by the patterning process, in which the active layer 202 of the driving TFT, the active layer 203 of the switching TFT and the pixel electrode 204 are on the same layer.

Mode 2: forming a metal oxide semiconductor film (for instance, an IGZO film, a ZnO film, an IZO film, an ITZO film or an HIZO film) and forming the patterns of the active layer 203 of the switching TFT and the pixel electrode 204 by the patterning process, namely the pixel electrode 204 and the active layer 203 of the switching TFT are made of the same material, and the active layer 202 of the driving TFT, the active layer 203 of the switching TFT and the pixel electrode 204 are on the same layer. Compared with the mode 1, the mode 2 can reduce the use of one mask and hence save more process. In one example, the switching TFT may be an NMOS transistor.

Figure 4:
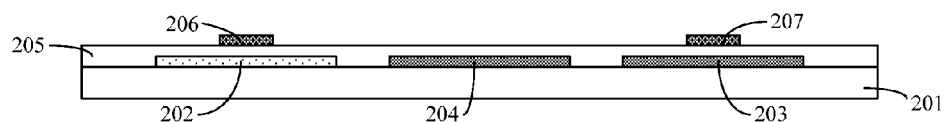
FIG. 4 is a schematic structural view illustrating the process of forming patterns of a gate insulating layer and a gate electrode on the base substrate in the method for manufacturing the array substrate provided by the embodiment of the present invention.

Step S2: as illustrated in FIG. 4, forming patterns of a gate insulating layer 205, a gate electrode 206 of the driving TFT and a gate electrode 207 of the switching TFT on the base substrate as illustrated in FIG. 3.

The step S2, for instance, may further comprise:

forming a gate insulating film which is taken as the gate insulating layer 205; and forming a gate metal film on the gate insulating layer 205 and respectively forming patterns of the gate electrode 206 of the driving TFT and the gate electrode 207 of the switching TFT at areas corresponding to the pattern of the active layer 202 of the driving TFT and the pattern of the active layer 203 of the switching TFT by the patterning process.

Step S3: as illustrated in FIG. 4, doping the active layer 202 of the driving TFT. The step S3 may be for instance performed as follows.

Figure 5:
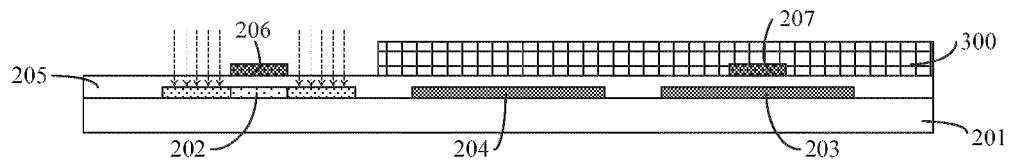
FIG. 5 is a schematic diagram illustrating the process of doping the active layer of the driving TFT in the method for manufacturing the array substrate provided by the embodiment of the present invention.

A layer of photoresist 300 is coated and exposure and development are performed on the photoresist 300 via a mask to retain the photoresist 300 at the area of the pattern of the active layer 203 of the switching TFT and an area of the pattern of the pixel electrode 204, the photoresist 300 at the area of the active layer 202 of the driving TFT is removed by development so as to expose the pattern of the active layer 202 of the driving TFT. As illustrated in FIG. 5, in the doping process, the photoresist 300 is configured to shield the area of the pattern of the active layer 203 of the switching TFT and the area of the pattern of the pixel electrode 204; the gate electrode 206 over the active layer 202 is configured to shield one part of the area of the active layer 202; and the area of the active layer 202 of the driving TFT, which is not shielded by the gate electrode 206, is subjected to doping treatment. The retained photoresist 300 is removed after the doping process and the doped active layer 202 of the driving TFT is formed. In one example, the driving TFT is, for instance, a PMOS transistor. Therefore, in this case, the doping process is, for instance, the P+ doping process.

Figure 6:
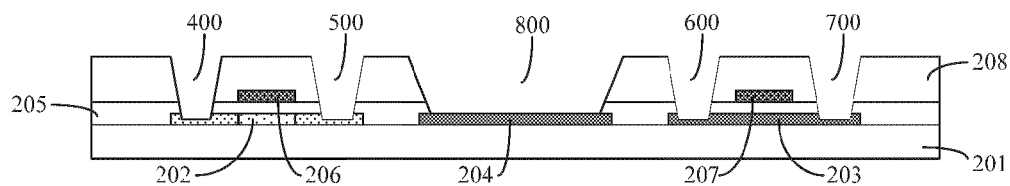
FIG. 6 is a schematic structural view illustrating the process of forming patterns of an insulating spacer layer, a through hole and a pixel electrode recess on the base substrate in the method for manufacturing the array substrate provided by the embodiment of the present invention.

Step S4: forming patterns of an insulating spacer layer 208, a through hole formed on the insulating spacer layer 208 and a pixel electrode recess 800, in which one part of the pattern of the pixel electrode 204 is exposed via the pixel electrode recess 800. The substrate obtained after the step is as illustrated in FIG. 6. The step S4 may for instance be performed as follows.

An insulating film, taken as the insulating spacer layer 208, is formed on the substrate as illustrated in FIG. 5. A first through hole 400, which runs through the insulating spacer layer 208 and the gate insulating layer 205 and reaches the pattern of the active layer 202 of the driving TFT at an area corresponding to a source electrode of the driving TFT to be formed, is formed by the patterning process; a second through hole 500, which runs through the insulating spacer layer 208 and the gate insulating layer 205 and reaches the pattern of the active layer 202 of the driving TFT at an area corresponding to a drain electrode of the driving TFT to be formed, is formed by the patterning process; a third through hole 600, which runs through the insulating spacer layer 208 and the gate insulating layer 205 and reaches the pattern of the active layer 203 of the switching TFT at an area corresponding to a source electrode of the switching TFT to be formed, is formed by the patterning process; a fourth through hole 700, which runs through the insulating spacer layer 208 and the gate insulating layer 205 and reaches the pattern of the active layer 203 of the switching TFT at an area corresponding to a drain electrode of the switching TFT to be formed, is formed by the patterning process; and a pixel electrode recess 800, which runs through the insulating spacer layer 208 and the gate insulating layer 205 and reaches the pattern of the pixel electrode 204 at an area corresponding to the pattern of the pixel electrode 204, is formed. The first through hole, the second through hole, the third through hole, the fourth through hole and the pixel electrode recess 800 may be formed by the same mask simultaneously.

Figure 7:
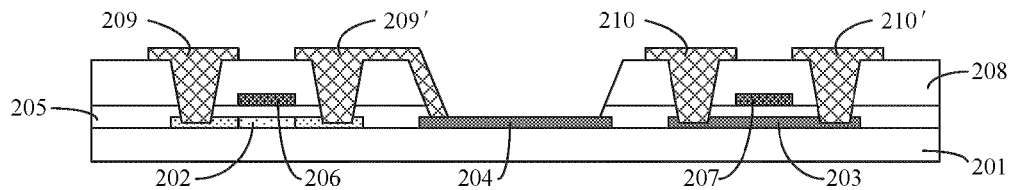
FIG. 7 is a schematic structural view illustrating the process of forming patterns of source and drain electrodes of the driving TFT and source and drain electrodes of the switching TFT on the base substrate in the method for manufacturing the array substrate provided by the embodiment of the present invention.

Step S5: forming patterns of a source electrode 209 and a drain electrode 209' of the driving TFT and patterns of a source electrode 210 and a drain electrode 210' of the switching TFT. The drain electrode 209' of the driving TFT is, for instance, connected to the pixel electrode 204, and the drain electrode of the switching TFT is, for instance, connected to the source electrode of the driving TFT. As illustrated in FIG. 7, source and drain metal films are formed and the patterns of the source electrode 209 and the drain electrode 209' of the driving TFT and the patterns of the source electrode 210 and the drain electrode 210' of the switching TFT are formed by the patterning process, in which the drain electrode 209' of the driving TFT is connected to the pixel electrode 204.

Figure 8:
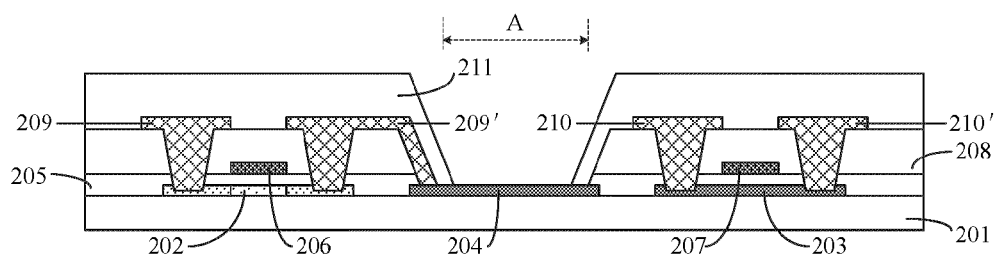
FIG. 8 is a schematic structural view of the array substrate manufactured by the method for manufacturing the array substrate provided by the embodiment of the present invention.

Step S6: forming a pattern of a pixel define layer 211. The step may, for instance, be performed as follows. An insulating film made of resin materials is formed; and as illustrated in FIG. 8, the pattern of the pixel define layer 211 is formed by the pattering process to cover all the other areas on the base substrate except for an area A of the pattern of the exposed pixel electrode 204. The exposed pixel electrode 204 may be taken as an anode of a subsequently formed organic light-emitting diode (OLED).

In the method for manufacturing the array substrate provided by the embodiment, the pixel electrode is manufactured on the same layer with the active layers of the driving TFT and the switching TFT, so that the number of required mask processes can be reduced. For instance, only 8 mask processes are required. Moreover, the pixel electrode and the active layer of the switching TFT may be manufactured simultaneously by the same material, so that the number of the required mask processes can be further reduced. For instance, only 7 mask processes are required. Therefore, the number of the mask processes in the manufacturing process is reduced and hence the process flow and the manufacturing cost are reduced. In addition, as the application does not need to adopt the LTPS technology to form the oxide TFT applied to the switching TFT, and the tact time during the crystallization can be reduced and the service life of a laser tube can be prolonged, and hence the manufacturing cost can be reduced.

Moreover, in the process of manufacturing a CMOS array display panel, for instance, an oxide TFT is, for instance, formed at a display area of an array substrate and taken as a switching TFT; and a gate driver on array (GOA) shift resister and TFTs on the peripheral area may be formed by the LTPS technology, and hence the driving TFT formed by the LTPS technology is only disposed on the peripheral area. Therefore, the laser annealing process used for preparing the driving TFT only requires the crystallization of a GOA shift register area and the peripheral area, but not all the areas of the array substrate, and hence the tact time during the crystallization can be reduced and the service life of a laser tube can be prolonged, and consequently the manufacturing cost can be reduced.

The embodiment of the present invention further provides an array substrate manufactured by the above method. As illustrated in FIG. 8, the array substrate comprises a substrate 201, an active layer 202 of a driving TFT, an active layer 203 of a switching TFT, a pixel electrode 204, a gate insulating layer 205, gate electrodes (a gate electrode 206 of the driving TFT and a gate electrode 207 of the switching TFT), an insulating spacer layer 208 (including a through hole thereon), source and drain electrodes (a source electrode 209 and a drain electrode 209' of the driving TFT and a source electrode 210 and a drain electrode 210' of the switching TFT) and a pixel define layer 211 from the bottom up. The drain electrode 210' of the switching TFT is connected with the source electrode 209 of the driving TFT, and the drain electrode 209' of the driving TFT is connected with the pixel electrode 204. In addition, the pixel electrode 204, the active layer 202 of the driving TFT and the active layer 203 of the switching TFT are on the same layer.

In the array substrate, the driving TFT is, for instance, an LTPS TFT, and the switching TFT is, for instance, an oxide TFT. The pixel electrode 204 and the active layer of the oxide TFT are, for instance, made of the same material.

The embodiment of the present invention further provides a display device, which comprises the array substrate according to any one of the above examples.

One example of the display device is a liquid crystal display (LCD) device, in which a TFT array substrate and an opposing substrate are arranged opposite to each other to form a liquid crystal cell; and liquid crystal materials are filled into the liquid crystal cell. The opposing substrate is, for instance, a color filter substrate. A pixel electrode of each pixel unit of the TFT array substrate is configured to apply an electric field to control the rotation degree of the liquid crystal materials and hence achieve the display function. In some examples, the LCD further includes backlights for providing backlight for the array substrate.

Another example of the display device is an OLED display device, in which a pixel electrode of each pixel unit of the TFT array substrate is taken as an anode or a cathode and configured to drive organic luminescent materials to emit light and hence achieve the display function.

The display device, for instance, may be: electronic paper, a mobile phone, a tablet PC, a television, a display, a notebook computer, a digital picture frame, a navigator or any other product or component with display function.

It should be obvious to those skilled in the art that: although the present invention has been described above in detail with the general description and the preferred embodiments, some modifications or improvements can be made to the present invention on the basis of the present invention. Therefore, all the modifications or improvements made without departing from the spirit of the present invention should fall within the scope of protection of the present invention.

What is claimed is:

1. A method for manufacturing an array substrate, comprising step S1: forming a pattern of an active layer of a driving TFT, a pattern of an active layer of a switching thin-film transistor (TFT) and a pattern of a corresponding pixel electrode on a base substrate, wherein the active layer of the driving TFT, the active layer of the switching TFT and the pixel electrode are in a same layer;
    step S2: forming a pattern of a gate insulating layer, a pattern of a gate electrode of the driving TFT and a pattern of a gate electrode of the switching TFT on the base substrate obtained after the step S1;
    step S3: doping the active layer of the driving TFT on the base substrate obtained after the step S2;
    step S4: forming patterns of an insulating spacer layer, a through hole formed on the insulating spacer layer, and a pixel electrode recess on the base substrate obtained after the step S3, wherein one part of the pattern of the pixel electrode is exposed via the pixel electrode recess; and
    step S5: forming patterns of a source electrode and a drain electrode of the driving TFT and patterns of a source electrode and a drain electrode of the switching TFT on the base substrate obtained after the step S4, wherein the drain electrode of the driving TFT is electrically connected with the pixel electrode,
    wherein the pattern of the active layer of the switching TFT, the pattern of the active layer of the driving TFT and the pattern of the corresponding pixel electrode are all located at a side of the gate insulating layer facing the base substrate,
    the pattern of the active layer of the switching TFT and the pattern of the corresponding pixel electrode are formed with a same material by a same patterning process simultaneously,
    the pattern of the active layer of the driving TFT and the pattern of the corresponding pixel electrode are made of different materials, and
    the source electrode and the drain electrode of the switching TFT are not electrically connected with the pixel electrode.

2. The method for manufacturing the array substrate according to claim 1, wherein the step S1 comprises: forming a metal oxide semiconductor film and patterning the metal oxide semiconductor film to form the patterns of the active layer of the switching TFT and the pixel electrode.

3. The method for manufacturing the array substrate according to claim 1, wherein the step S1 comprises: forming a transparent conductive film and patterning the transparent conductive film to form the pattern of the pixel electrode; and forming a metal oxide semiconductor film and patterning the metal oxide semiconductor film to form the pattern of the active layer of the switching TFT.

4. The method for manufacturing the array substrate according to claim 1, wherein the step of forming the pattern of the active layer of the driving TFT in the same layer comprises: forming an amorphous silicon film and crystallizing the amorphous silicon film to form a polysilicon film; and patterning the polysilicon film to form the pattern of the active layer of the driving TFT.

5. The method for manufacturing the array substrate according to claim 2, wherein the metal oxide semiconductor film is an indium gallium zinc oxide (IGZO) film, a zinc oxide (ZnO) film, an indium zinc oxide (IZO) film, an indium tin zinc oxide (ITZO) film or a hafnium indium zinc oxide (HIZO) film.

6. The method for manufacturing the array substrate according to claim 1, further comprising:
   step S6: forming a pattern of a pixel define layer on the base substrate obtained after the step S5.

7. The method for manufacturing the array substrate according to claim 6, wherein the step S2 further comprises:
   forming a first insulating film which is taken as the gate insulating layer; and
   forming a first metal film on the gate insulating layer and patterning the first metal film to form the pattern of the gate electrode of the driving TFT and the pattern of the gate electrode of the switching TFT at areas corresponding to the pattern of the active layer of the driving TFT and the pattern of the active layer of the switching TFT, respectively.

8. The method for manufacturing the array substrate according to claim 6, wherein the step S3 comprises:
   applying photoresist and performing exposure and development on the photoresist via a mask to retain the photoresist at an area of the pattern of the active layer of the switching TFT and an area of the pattern of the pixel electrode, remove the photoresist at the area of the pattern of the active layer of the driving TFT by development, and expose the pattern of the active layer of the driving TFT; and
   doping the active layer of the driving TFT and removing the retained photoresist after the doping process.

9. The method for manufacturing the array substrate according to claim 6, wherein the step S4 comprises:
   forming a second insulating film which is taken as the insulating spacer layer; and
   forming a first through hole and a second through hole which run through the insulating spacer layer and the gate insulating layer and reach the pattern of the active layer of the driving TFT, a third through hole and a fourth through hole which run through the insulating spacer layer and the gate insulating layer and reach the pattern of the active layer of the switching TFT, and the pixel electrode recess which runs through the insulating spacer layer and the gate insulating layer and reaches the pattern of the pixel electrode, by a patterning process, wherein the first through hole and the second through hole correspond to areas of the source electrode and the drain electrode of the driving TFT to be formed; and the third through hole and the fourth through hole correspond to areas of the source electrode and the drain electrode of the switching TFT to be formed.

10. The method for manufacturing the array substrate according to claim 6, wherein the step S5 comprises:
    forming a second metal film and patterning the second metal film to form the patterns of the source electrode and the drain electrode of the driving TFT and the patterns of the source electrode and the drain electrode of the switching TFT, wherein the drain electrode of the driving TFT is connected with the pixel electrode.

11. The method for manufacturing the array substrate according to claim 6, wherein the step S6 comprises:
    forming a third insulating film and patterning the third insulating film so as to expose one part of the pattern of the pixel electrode under the third insulating film and hence form the pattern of the pixel define layer.

\* \* \* \* \*